United States Patent [19]
Trow et al.

[11] Patent Number: 5,824,607
[45] Date of Patent: Oct. 20, 1998

[54] PLASMA CONFINEMENT FOR AN INDUCTIVELY COUPLED PLASMA REACTOR

[75] Inventors: John Trow, San Jose; Tetsuya Ishikawa, Santa Clara, both of Calif.

[73] Assignee: Applied Materials, Inc., Santa Clara, Calif.

[21] Appl. No.: 796,166

[22] Filed: Feb. 6, 1997

[51] Int. Cl.[6] .......................... H01L 21/461; B05C 11/02; C13F 1/62; B08B 6/00

[52] U.S. Cl. ..................................... 438/732; 118/723 IR; 118/723 MA; 156/345; 216/70; 134/1.1

[58] Field of Search ............................ 118/723 R, 723 I, 118/723 IR, 723 MR, 723 MA, 723 AN; 156/345; 204/298.37; 438/711, 714, 732; 216/70, 71; 134/1.1

[56] References Cited

U.S. PATENT DOCUMENTS

| | | | |
|---|---|---|---|
| 4,438,368 | 3/1984 | Abe et al. | 315/39 |
| 4,740,268 | 4/1988 | Buckhman | 156/643 |
| 5,181,986 | 1/1993 | Ohiwa | 156/643 |
| 5,198,725 | 3/1993 | Chen et al. | 315/111.41 |
| 5,223,457 | 6/1993 | Mintz et al. | 437/225 |
| 5,266,146 | 11/1993 | Ohno et al. | 156/345 |
| 5,389,154 | 2/1995 | Hiroshi et al. | 118/723 MR |
| 5,514,246 | 5/1996 | Blalock | 156/643.1 |
| 5,556,501 | 9/1996 | Collins et al. | 156/345 |
| 5,587,205 | 12/1996 | Saito et al. | 427/553 |

*Primary Examiner*—R. Bruce Breneman
*Assistant Examiner*—Luz Alejandro
*Attorney, Agent, or Firm*—Patterson & Streets, L.L.P.

[57] ABSTRACT

A plasma reactor chamber uses an antenna driven by RF energy (LF, MF, or VHF) which is inductively coupled inside the reactor dome to provide a plasma source. The antenna generates a high density, low energy plasma inside the chamber. The chamber includes a plurality of magnets for generating magnetic fields. Ion flux is concentrated in certain areas of the chamber and is diverted from other areas of the chamber by using these magnetic fields. Various magnetic and voltage processing enhancement techniques are disclosed, along with etch processes, deposition processes and combined etch/deposition processes. The disclosed invention provides a means of cleaning the deposition residues from the reactor walls while minimizing damage to the wafer pedestal.

24 Claims, 2 Drawing Sheets ns of the invention ...

PLASMA CONFINEMENT FOR AN INDUCTIVELY COUPLED PLASMA REACTOR

FIELD OF THE INVENTION

The present invention relates to a plasma processing chamber and, more particularly, to a plasma enhanced chemical vapor deposition (CVD) chamber which uses magnetic fields to confine or guide electrons and ions generated by an inductively coupled plasma source to modify the diffusion and surface recombination pattern inside the chamber.

BACKGROUND OF THE INVENTION

Plasma chambers used for semiconductor processes such as chemical vapor deposition (CVD), etching, reactive ion etching and so forth typically employ either inductive coupling or capacitive coupling to strike and maintain a plasma. Typically, an etch chamber employs capacitive coupling because the high ion energies characteristic of capacitively coupled plasmas are suitable for removing films such as, for example, silicon dioxide. The high ion energies arise from the high electric fields required to strike a capacitively coupled plasma. For example, a capacitively coupled chamber has parallel electrodes, including a grounded electrode in the top and an RF biased electrode in the wafer pedestal.

However, the plasma density of a capacitively coupled plasma is not sufficient for performing simultaneous chemical vapor deposition (CVD) and in-situ sputtering at low pressures. Accordingly, for such processes a CVD plasma chamber employs inductive coupling to strike and maintain the plasma. In one example of a chamber, a domed-shaped helical coil in a dome-shaped chamber ceiling performs the inductive coupling to the plasma at a low chamber pressure (below 100 milliTorr), the dome shape providing a more uniform ion density distribution across the semiconductor wafer. Such an inductively coupled plasma is characterized by a high ion density and is therefore suitable for low pressure CVD plasma processing at high processing (e.g., deposition rates).

The main differences between capacitively coupled plasmas and inductively coupled plasmas are the following: an inductively coupled plasma has a plasma density which is up to two orders of magnitude higher, thereby providing higher processing rates. A capacitively coupled plasma has a higher electrode sheet voltage, higher self-biasing and higher plasma impedance, and therefore provides higher sputtering rates and greater risk of damage to the wafer. An inductively coupled plasma exhibits lower ion energy distribution, providing a lower risk of damage to the wafer.

A requirement of all plasma chambers, and especially plasma CVD chambers, is that they must be cleaned periodically to remove deposits and residue. For example, in a CVD chamber, during deposition of silicon dioxide onto a semiconductor wafer, silicon dioxide is deposited onto the chamber walls and ceiling as well as other parts of the chamber, changing the characteristics of the chamber and giving rise to particulate contamination. Therefore, the reactor chamber must be cleaned periodically to remove all such deposits and residue therefrom. Removal of silicon dioxide deposits is accomplished by introducing a fluoride-containing etchant gas such as $NF_3$ (for example) into the chamber and striking a plasma to perform a chamber cleaning operation.

One limitation of inductively coupled plasma reactors is that more time is required to clean the chamber because the volume in a high density reactor is larger, operation pressure is low, the dome is non-conductive and there is a lack of bias of the chamber wall surfaces. Certain residues, such as silicon dioxide, typically have relatively low etch rates at low ion energies, and therefore can be difficult to remove by inductively coupled plasmas.

One problem with chamber cleaning operations is that the various surfaces of the reactor chamber interior are not cleaned (etched) at the same rate, due to differences in location in the chamber and differences in materials. The plasma density and ion energies are not the same at all locations in the chamber, so that differences in cleaning (etch) rates are quite typical. Moreover, during wafer processing (such as CVD processing), deposits build up more thickly on certain chamber surfaces than on others, so that the deposit or residue thickness is non-uniform throughout the chamber interior. For example, in an etch chamber, the etch-process residue may be much thicker in the center of the ceiling than at the edge of the ceiling, due to plasma density non-uniformity.

As a result, some surfaces are thoroughly cleansed of residue or deposits before others, and the cleaned surfaces are etched while the remaining contaminants are removed from the other still-unclean surfaces. In many applications, it would be beneficial to divert the plasma away from certain areas in the chamber while at the same time concentrating plasma into other areas of the chamber. For example, during processing, whether it be deposition or etching processes, material is deposited throughout the chamber. These deposits tend to accumulate in certain areas thereby causing a build-up of material which must be removed from the chamber to prevent particle contamination or other harm to devices subsequently formed on the chamber. In these instances, it would be beneficial to concentrate the plasma flux from the source during a cleaning gas discharge to those areas of the chamber where heavy residue build-up occurs during the processing phase, but away from the wafer processing pedestal to prevent unnecessary erosion of the pedestal surface during cleaning processes. One advantage in controlling the plasma flux is that the chamber could be cleaned without the need to move a cover wafer into the chamber to cover the pedestal. The elimination of the need to use a cover wafer reduces consumable costs of operation of the chamber and increases throughput of wafers. This advantage will become even more apparent as remote plasma sources are utilized to provide reactive cleaning gases into the chamber.

There is a need for an apparatus and method for confining and guiding the electrons and ions generated by an inductively coupled plasma source using magnetic fields. Preferably, the method and apparatus can be used to advantage with a high density plasma source or adapted for use with any type of source.

SUMMARY OF THE INVENTION

The present invention provides a plasma enhanced CVD chamber having an antenna driven by RF energy (LF, MF, or VHF) and one or more magnets to provide a magnetic field in the chamber to confine or guide the electrons and ions generated by the source in the chamber. The RF energy is inductively coupled inside the reactor dome to provide a plasma source. In one aspect of the invention, CVD processing gases are introduced into the chamber by a gas inlet ring and the chamber pressure is maintained by a gas control system employing a throttle valve and a gate valve and a turbo molecular pump. The antenna generates a high density, low energy plasma inside the chamber for deposition or etching of metals, dielectrics and other materials. The process proceeds in two distinct phases. First, a reactive plasma is generated by the antenna and the material is directed towards the wafer to be processed. As a byproduct of this step, material is deposited on certain areas of the chamber walls. Second, a distinct cleaning plasma, usually fluorine based, is generated in the chamber, or pumped into the chamber from a remote plasma source, and is directed by one or more magnetic fields towards the areas of where residue build-up occurs, and away from the wafer pedestal. Plasma confinement and direction during the cleaning phase is facilitated by use of externally generated magnetic fields. This produces an enhanced chamber cleaning technique which can considerably improve system throughput by confining or guiding the plasma flux to areas of heavy build-up, thereby increasing the efficiency of the cleaning process.

DETAILED DESCRIPTION OF THE PREFERRED EMBODIMENT

The present invention provides an apparatus and method for processing wafers and for confining and controlling a plasma flux using externally generated magnetic fields. More specifically, the present invention provides a system and method for high density plasma processing which includes one or more magnets disposed about a processing chamber which can be employed during a cleaning phase of processing to confine and guide the plasma flux away from certain areas, while at the same time concentrating the plasma flux in other areas of the processing chamber. The magnetic fields can be generated using electromagnets or permanent magnets, with electromagnets being preferred.

Figure 1:
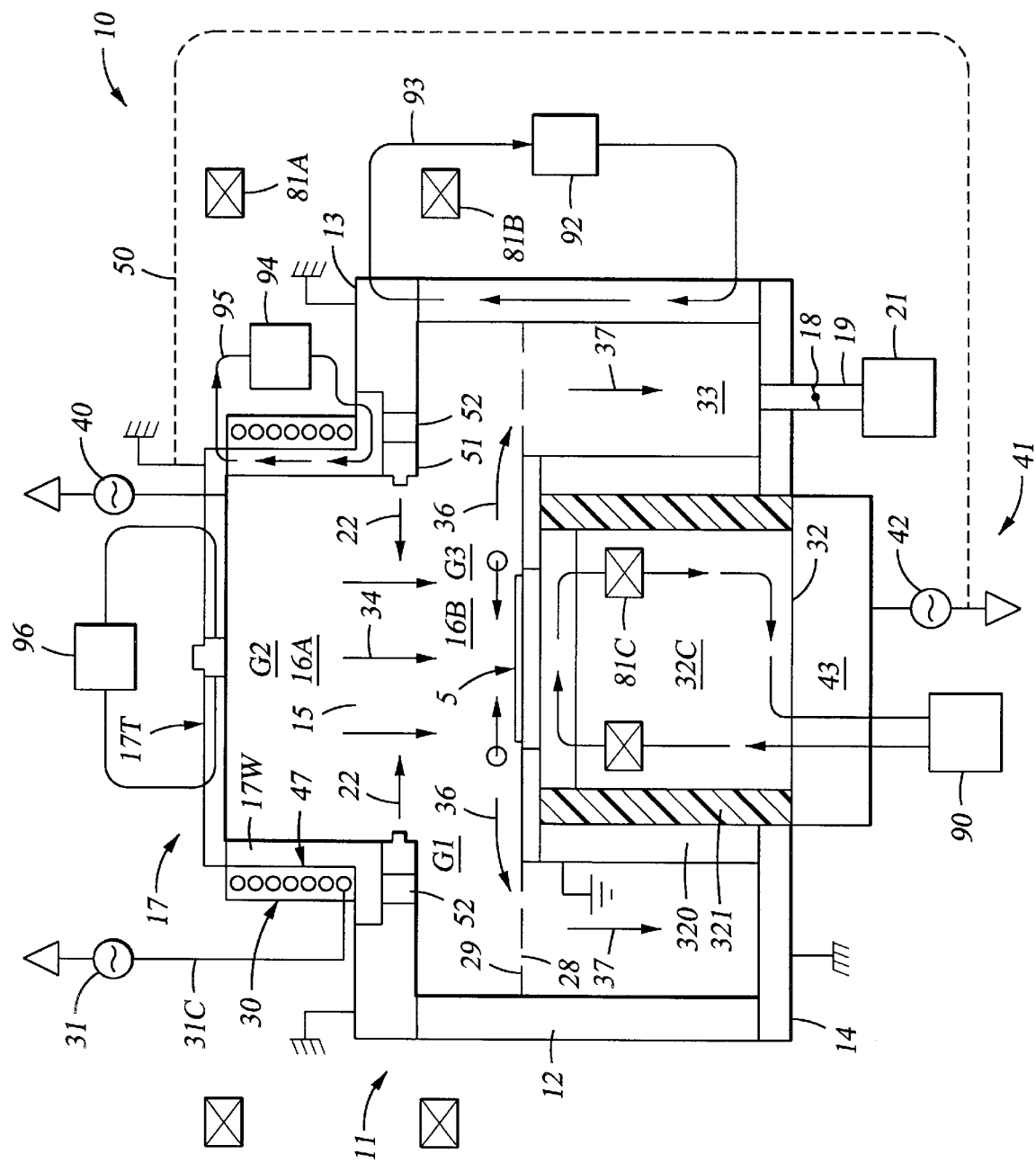
FIG. 1 is a schematic sectional view of a plasma chamber of the present invention.

FIG. 1 is a schematic sectional view of a high density plasma CVD processing chamber 10 having an inductively coupled plasma source arrangement and/or a capacitively coupled bias arrangement to generate a high density, low energy plasma within the chamber. Typically, plasma is easier to strike using a capacitively coupled source. The exemplary system 10 includes a vacuum chamber housing 11, preferably formed of anodized aluminum or other suitable material, having sidewalls 12, a top 13 and a bottom wall 14. Anodized aluminum is preferred because it suppresses arcing and sputtering. However, other materials such as bare aluminum with or without a process-compatible liner of polymer, quartz, ceramic or the like can be used. The top 13 has a central opening 15 between a lower chamber wafer processing region 16B defined between sidewalls 12 and an inductively coupled plasma source region 16A defined by a dome 17 having a dome wall 17W, a top 17T and an RF coil antenna 30 disposed about the dome wall 17W.

The dome may be configured as an inverted cup with either one piece or with a separate side 17W and a top 17T which are formed of a dielectric material such as quartz or other dielectric material which is transparent to electromagnetic energy, including alumina and alpha-alumina (sapphire) and even partly of conducting materials depending on the exact antenna location. In the preferred arrangement shown in FIG. 1, the dome 17 comprises a cylindrical wall 17W made of a dielectric material such as quartz and a cover or top 17T made of aluminum or anodized aluminum.

RF energy is supplied to the dome by an inductive antenna coil 30 which is powered by an RF supply and matching network 31. The inductive antenna coil 30 is connected to the RF supply and matching network 31 through a transmission line 31C such as a wave guide or a co-axial cable. The antenna 30 preferably has a multiple turn cylindrical configuration and preferably has an electrical length of about one-quarter wavelength ($<\lambda/4$) at the operating frequency. Specifically, the antenna 30 is positioned outside and adjacent to the dome 17 and the plasma chamber 16A for coupling the RF magnetic fields into the source chamber 16A. These induced RF magnetic fields ionize at least part of the process gases and thus form a plasma in chamber 16A and processing chamber 16B characterized by relatively high density and low energy ions.

A grounded metallic shield 47, such as a Faraday shield, may be positioned between the antenna 30 and sidewall 17W to permit the inductive coupling to the source plasma but to preclude capacitive coupling due to the high RF voltages on the antenna itself. Strong capacitive coupling could produce deleterious effects such as a plasma high voltage sheath and attendant acceleration of charged particles (ions) to high energies.

In one embodiment, an additional RF power supply and matching network 40 can be used to supply power to the conductive, non-magnetic top plate 17T of the dome during processing or preferably the cleaning process, if desired. A capacitively coupled plasma and its attendant plasma sheath can be used to accelerate cleaning gas ions to effectively clean the inside surfaces of the chamber, which can be powered or grounded, by ion assisted etching.

The evacuation of the interior of the chamber housing 11 is controlled by a throttle valve 18 on a vacuum line 19 which connects to a vacuum pumping system 21 having one or more vacuum pumps such as a turbomolecular pump.

The chamber components, including the chamber walls 12, the dome wall 17W, and the dome top 17T, can be heated and/or cooled for process performance. For example, the chamber components can be heated or cooled by circulating a liquid or gas heat transfer medium through passages formed in the chamber components 90, 92, 94 and 96 as shown schematically in FIG. 1. The liquid or gas heat transfer medium preferably circulates along paths, such as path 93 for component 92 and path 95 for component 94. Alternatively, heating elements such as a resistive heating element (not shown) can be used to heat the dome directly.

As depicted in FIG. 1, process gases, purge gases, diluents, etc., can be supplied to the chamber by three gas injection manifolds, G1, G2, G3, located at the base of the dome 17, the center of the top plate 17T of the dome 17, and peripheral to the wafer 5, respectively. The gases are typically supplied to the chamber 11, for example, from one or more sources of pressurized gas via a computer-controlled gas flow controller (not shown). While three gas injection manifolds are preferably provided to the chamber, one or a combination of the three may be selected.

At the main gas inlet manifold G1, the gases enter the vacuum processing regions 16A, 16B, as indicated by the arrows 22 through nozzles 51 positioned around a quartz ring gas manifold 52 which is mounted on the inside of or integral with the process chamber top wall 13. The nozzles 51 preferably supply etching gases and/or deposition gases at a slight upward angle to the chamber regions 16A and 16B for developing an etching and/or deposition plasma upon application of RF energy to the inductive coil 30.

Preferably, the gas flow from the chamber region 16A is downward toward the wafer 5 as indicated by the arrows 34 and is then drawn radially outward over the exposed wafer surface. To this end, an annular vacuum manifold 33 is disposed beyond and around a pedestal 32, between chamber sidewalls 12, a grounded pedestal shield 32O, the chamber bottom wall 14 and a conductive manifold screen 29. The manifold screen 29 is interposed between the vacuum manifold 33 and the wafer processing region 16B and provides a conductive electrical path between the lower chamber walls 12 and the grounded pedestal shield 32O. The vacuum manifold 33 defines an annular pumping channel for implementing uniform radial pumping of exhaust gases from the periphery of the wafer 5. The vacuum manifold 33 communicates with the vacuum line 19.

The gas flow is along the arrows 22 from the main inlet manifold G1, and/or along the arrows 34 from the manifold G2 into the dome, and/or along the arrows 36 from the manifold G3 radially inward toward the wafer 5. The overall gas flow along the arrows 34 from the upper chamber region 16A is directed toward the wafer 5, then along the arrows 36 from the wafer and through the holes 28 in the manifold screen 29 into the gas outlet manifold 33, and along the path 37 from the exhaust manifold 33 to the exhaust system 21. It should be noted that the conductive manifold screen 29 is optional.

The plasma generated in the processing region 16A consists of ions and electrons, and is accompanied by free radicals and excited neutrals. The chemically active mixture moves downstream toward the wafer 5 by a combination of electrical forces, diffusion and by being entrained in the prevailing gas flow 34. Optionally, but preferably, a bias energy input arrangement 41 having a bias RF power supply source 42 and a bias matching network 43 couples RF energy to the wafer support electrode 32C for selectively biasing the wafer with a negative bias voltage and thus selectively increasing the positive ion energy at the wafer during the wafer processing phase. As an alternative to biasing the wafer 5 with respect to ground, the bias matching network 43 and the top 17T can be "ungrounded" and referenced to one another to create a differential bias, as indicated by the dotted connection 50. The wafer support electrode 32C is preferably surrounded by a non-porous low loss insulator 32I.

Preferably, the operating frequency of the RF power supply 31 for the source antenna 30 is selected to provide efficient inductive coupling of the RF power to the plasma to provide a dense plasma and yet to minimize ion bombardment damage to sensitive devices, such as the pedestal. Specifically, the upper frequency of the operating range is limited to minimize "current-induced" damage. The lower limit of the operating frequency is selected for efficiency of RF power coupling to the plasma. Preferably, low frequency to very high frequency (LF/VHF) RF power within the range of about 100 KHz to about 100 MHZ is used. Most preferably, medium frequency (MF) RF power within the range of about 300 KHz to about 3 MHZ is used.

During the wafer processing phase, it is desirable that the ions arrive at the wafer surface with some energy, but that there is no ion bombardment of the lid, sidewalls or pedestal. During this processing phase, RF bias supply 42 is used. During the subsequent cleaning phase, it is desirable that the ions arriving at specific regions of the walls having heavy deposition possess substantial energy, while there be essentially no ion bombardment of the bare pedestal 32 which preferably has no wafer or cover to protect it during this phase. Hence, the pedestal 32 may be grounded during the cleaning phase. Magnetic fields, as will be described below, are used to direct ion flow toward the chamber walls and away from the pedestal.

Figure 2:
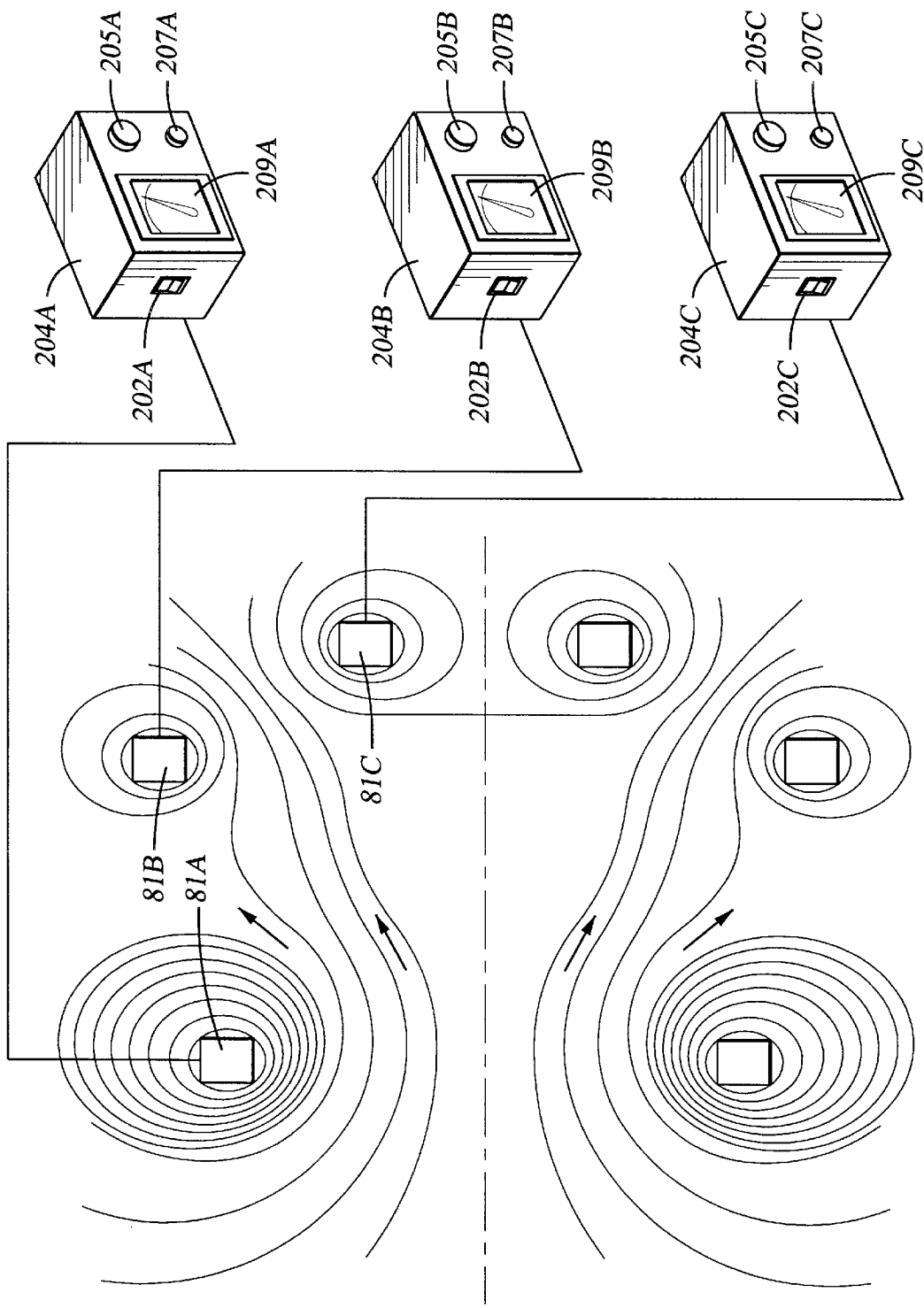
FIG. 2 is a schematic view of the magnetic field lines showing the confinement and guidance of the plasma flux during a cleaning process.

Electromagnetic coils 81A, 81B and 81C, which are powered by a DC or a pulsed DC current, are disposed adjacent to the chamber to produce magnetic fields during the cleaning phase which channel the ion flux away from the pedestal 32 and towards specific areas of the walls as indicated in FIG. 2 by the heavy arrows. While electromagnets are preferred, permanent magnets may also be used. Preferably, a first electromagnetic coil 81A is positioned to attract at least a portion of the plasma flux towards the dome 17, a second electromagnetic coil 81B is positioned to attract at least a portion of the plasma flux towards the sidewalls 12 and a third electromagnetic coil 81C is positioned to repel at least a portion of the plasma flux away from the pedestal. Each of the coils is comprised of from about 20 to about 120 turns. Charged particles (ions) will be generally directed along or parallel to the magnetic equipotential lines (field lines) and will feel a constraining force in the direction across the field lines.

In the present invention, the plasma flux from the inductively coupled plasma source is concentrated during the plasma cleaning phase onto those areas of the wall with heavy residue build-up and away from the wafer pedestal 32. This is accomplished through the use of a DC magnetic field generated by coils 81A, 81B and 81C (shown in FIG. 2) powered by a remote DC power source. In a preferred embodiment, the current to the coil 81A is about 50 amperes, the current to coil 81B is about 25 amperes and the current to coil 81C is about 25 amperes, but in the opposite sense of that supplied to the other two coils. The magnetic field lines generated are shown in FIG. 2 and the general direction of the ion flux is indicated by the heavy arrows.

FIG. 2 shows a block diagram of a preferred embodiment of a control mechanism for controlling the flow of gas during the cleaning phase in accordance with the present invention. As can be seen, there are a plurality of switches 202a, 202b and 202c which are individually coupled in a plurality of DC power supplies 204a, 204b and 204c, respectively.

In a preferred embodiment, the switches 202a, 202b and 202c under control of a microcontroller (not shown) selectively activate their power supplies 204a–c during the cleaning phase. It should be understood by one of ordinary skill in the art that the switches could be controlled manually, through an electromechanical device or in some other similar manner.

Each of the power supplies 204a–204c includes a switch indicator lamp 205a–205c which indicates whether the power supply is on or off and a control knob 207a–207c to provide an indication of the overall current being supplied to the coils. Each of the power supplies 204a–204c also includes a display or meter 209a–209c to selectively display the voltage or current output of the DC power supplies. In this embodiment, the power supply 204a is coupled to the coil 81A, the power supply 204b is coupled to coil 81B, and the power supply 204c is coupled to coil 81C.

Through the use of this arrangement, ion flux can be moved either more strongly toward the walls 12, 17W or more strongly away from the pedestal 32 to clean the specific area of the walls as indicated. Electromagnetic coils 81A and 81B are used to move the flow of gas and ion flux away from the pedestal and towards specific areas of the walls based upon the current supplied by the power supplies 204A and 204B. Electromagnetic coil 81C would be used to move the flow of gas and ion flux in an up or down direction within the chamber depending upon the current supplied.

As indicated above, the above-described reactor embodying the present invention is uniquely useful for numerous plasma processes such as reactive ion etching (RIE), high pressure plasma etching, low pressure chemical vapor deposition (CVD) including sputter facet deposition and planarization, and high pressure conformal isotropic CVD. Other applications include, but are not limited to, sputter etching, ion beam etching, or as an electron, ion or active neutral plasma source.

Accordingly, the present invention utilizes a remote plasma source in conjunction with a DC magnetic field to concentrate plasma on certain areas of the plasma boundary and to inhibit the flow in other areas. Through this system a plasma reactor is provided in which ion distribution is modified to place the plasma energy in the appropriate location while also simultaneously diverting the plasma energy from the appropriate locations. In a preferred embodiment, this system is utilized to maximize cleaning efficiency by providing maximum plasma energy to the surface walls of the vessel and by diverting the plasma away from the wafer pedestal.

It should be understood that other types of systems could be utilized to control the current to the coils and hence the ion flux to provide the desired effect. For example, the system could be computer controlled, in which the coil power supplies could be controlled by a microcontroller (not shown) to which the cleaning could be accomplished via an iterative manner in which the walls are inspected on a periodic basis after application of the magnetic energy to the coils.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A plasma processing system, comprising:
    (a) a vacuum chamber having a top a bottom and a sidewall;
    (b) a wafer support member disposed in the vacuum chamber;
    (c) a plasma source disposed adjacent to the vacuum chamber, providing a plasma flux to the vacuum chamber;
    (d) a first magnet disposed adjacent to the chamber to generate at least a first magnetic field to attract the plasma flux toward the sidewall; and
    (e) a second magnet disposed below an upper surface of the wafer support member to generate at least a second magnetic field to repel the plasma flux from the wafer support member.

2. The system of claim 1 wherein the wafer support member comprises an electrode.

3. The system of claim 1 wherein the plasma source comprises an inductively coupled source device.

4. The system of claim 1 further comprising a capacitively coupled source device.

5. The system of claim 1 wherein the first and second magnets comprise at least a first and a second permanent magnet.

6. The system of claim 1 wherein the first and second magnets comprise at least a first and a second electromagnet.

7. The system of claim 1 further comprising a third magnet disposed adjacent to the top of the chamber to attract the plasma flux toward the top of the chamber.

8. The system of claim 7 wherein the first, second and third electromagnets comprise at least a first, a second and a third coil.

9. The system of claim 8 further comprising a first power supply coupled to the first coil, a second power supply coupled to the second coil and a third power supply coupled to the third coil.

10. The system of claim 9 wherein each of the first, second and third power supplies includes a switch for enabling each of the first, second and third power supplies.

11. The system of claim 7 wherein the third magnetic generating member comprises at least a third electromagnet.

12. The system of claim 1 wherein the second magnetic field generating member is disposed within the wafer support member.

13. A method for controlling plasma energy in a processing chamber, comprising the steps of:
    (a) providing a wafer support member in the chamber;
    (b) generating a plasma flux in the chamber;
    (c) providing one or more magnetic field generating members adjacent the chamber;
    (d) generating one or more magnetic fields to concentrate the plasma flux in selected areas of the chamber;
    (e) providing a repelling magnetic field generating member disposed adjacent the wafer support member; and
    (f) generating a repelling magnetic field to repel the plasma flux from the substrate support member.

14. The method of claim 13 wherein the step of generating a plasma flux in the chamber comprises inductively coupling energy into the chamber.

15. The method of claim 14 wherein the one or more magnetic field generating members comprise one or more coils and wherein the step of generating the one or more magnetic fields comprises delivering power to the one or more coils.

16. The method of claim 15 wherein power is selectively delivered to the one or more coils to confine and guide the plasma flux.

17. A plasma processing system, comprising:
    (a) a vacuum chamber having a top, a bottom and a sidewall;
    (b) a wafer support member disposed in the vacuum chamber;
    (c) a plasma source disposed adjacent to the vacuum chamber, providing a plasma flux to the vacuum chamber;
    (d) a first magnet disposed adjacent to the chamber to generate at least a first magnetic field to attract the plasma flux toward the sidewall; and
    (e) a second magnet disposed below an upper surface of the wafer support member to generate at least a second magnetic field to repel the plasma flux from the wafer support member.
    (f) a controller for selectively activating the magnet during a cleaning process.

18. The system of claim 17 wherein the plasma source comprises an inductively coupled source device.

19. The system of claim 17 further comprising a capacitively coupled source device.

20. The system of claim 17 wherein the first and second magnets comprise at least a first and a second electromagnet and the controller selectively activates the second magnet.

21. The system of claim 20 further comprising a third magnet disposed adjacent to the top of the chamber to attract the plasma flux toward the top of the chamber.

22. The system of claim 21 wherein the first, second and third electromagnets comprise at least a first, a second and a third coil.

23. The system of claim 22 further comprising a first power supply coupled to the first coil, a second power supply coupled to the second coil and a third power supply coupled to the third coil.

24. The system of claim 23 wherein each of the first, second and third power supplies includes a switch for enabling each of the first, second and third power supplies.

* * * * *